(12) United States Patent
McKeen et al.

(10) Patent No.: US 6,400,567 B1
(45) Date of Patent: Jun. 4, 2002

(54) EQUIPMENT ENCLOSURE HAVING SEPARATE COMPARTMENTS COOLED BY SEPARATE COOLING AIRFLOWS

(75) Inventors: John McKeen, New City, NY (US); Willie Braun, Franklin Lakes, NY (US)

(73) Assignee: Fujitsu Network Communications, Inc., Richardson, TX (US)

( * ) Notice: Subject to any disclaimer, the term of this patent is extended or adjusted under 35 U.S.C. 154(b) by 0 days.

(21) Appl. No.: 09/694,101

(22) Filed: Oct. 19, 2000

(51) Int. Cl.[7] .................................................. H05H 7/20
(52) U.S. Cl. ........................ 361/695; 62/259.2; 454/184
(58) Field of Search .................. 62/259.2; 361/687–688, 361/690, 694–695; 454/185

(56) References Cited

U.S. PATENT DOCUMENTS

| 3,967,874 A | 7/1976 | Calabro | 339/112 R |
|---|---|---|---|
| 4,399,485 A | 8/1983 | Wright et al. | 361/383 |
| 4,860,163 A | 8/1989 | Sarath | 361/384 |
| 4,894,749 A | 1/1990 | Elko et al. | 361/383 |
| 5,063,477 A | * 11/1991 | Paggen et al. | 361/695 |
| 5,210,680 A | 5/1993 | Scheibler | 361/384 |
| 5,375,038 A | 12/1994 | Hardt | 361/694 |
| 5,432,674 A | * 7/1995 | Hardt | 361/694 |
| 5,563,768 A | 10/1996 | Perdue | 361/695 |
| 5,813,243 A | * 9/1998 | Johnson et al. | 62/259.2 |
| 5,914,858 A | 6/1999 | McKeen et al. | 361/695 |

* cited by examiner

Primary Examiner—Gregory Thompson
(74) Attorney, Agent, or Firm—Weingarten, Schurgin, Gagnebin & Lebovici LLP

(57) ABSTRACT

An enclosure that includes at least first and second pieces of equipment having separate cooling airflows. A baffle is disposed within the enclosure to separate the enclosure into two compartments and to isolate the airflows for each piece of equipment within each of the respective compartments. The baffle includes a step portion to provide for a smooth airflow and to prevent hot spots from being formed on the baffle. The heated airflow from the second compartment is redirected away from the first compartment to an air duct or chimney that transports the heated air from the second compartment to an air output vent. When acting as a chimney, the air duct includes a flue portion, a buffer portion to enhance the convection draft, and an output opening. The separate airflows may be either convection driven or be a forced airflow driven by one or more fans.

12 Claims, 4 Drawing Sheets

EQUIPMENT ENCLOSURE HAVING SEPARATE COMPARTMENTS COOLED BY SEPARATE COOLING AIRFLOWS

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

This invention relates generally to enclosures cooled by an airflow.

Electrical equipment such as computer hardware, computer network interfaces, and telecommunications equipment are usually mounted in enclosures to provide the necessary physical security from environmental hazards and to maximize the use of the available space. Although these enclosures may be deployed indoors, the enclosures nonetheless must be generally sealed, for example to protect the electronic equipment from potential hazards, such as a leak in a water pipe, a leak in a roof or broken window allowing water to enter the building, or the activation of a fire suppression water sprinkler system. The electronic equipment contained within the enclosures generates a significant amount of heat that must be removed from the enclosure in order to prevent thermal damage to the electronic equipment.

Prior art solutions to the heat removal problem have included drawing room temperature air into the enclosure through air vents. The cooler room temperature air flows through the enclosure and over and/or through the electronic equipment, cooling it. The heated air is then directed out of the enclosure into the ambient room environment. This airflow may be forced, using fans, or unforced using convection.

Care must be taken in directing the airflow within the enclosure to avoid reusing air that has been heated by a first piece of electronic equipment to cool a second piece of electronic equipment. If this occurs, there will be less effective heat transfer from the second piece of electronic equipment to the cooling airflow. Depending on the characteristics of the piece of electronic equipment and the temperature of the airflow from the first piece of electronic equipment, there may be insufficient heat transfer taking place at the second piece of equipment. This may lead to overheating the second piece of electronic equipment and potential thermal damage.

One prior art solution is to limit an enclosure to contain only a few pieces of heat generating electronic equipment. This leads to the concomitant increase in cabling between a larger number of enclosures, reduces the efficiency of the use of space, and increases the cost of parts, installation, and maintenance. Another prior art solution is to arrange the equipment such that there are dead spaces within the enclosure where equipment cannot be placed due to the trajectory of the cooling airflow. This solution likewise leads to the need for larger enclosures that are heavier and costlier than need be.

It would therefore be desirable to provide an enclosure that provides for an efficient transfer of heat generated by electronic equipment and that allows the space within the enclosure to be efficiently used.

BRIEF SUMMARY OF THE INVENTION

In accordance with the present invention an improved enclosure that provides separate cooling airflows is disclosed. Efficient heat transfer is achieved while an efficient use of space is maintained.

The enclosure includes a three-sided removable cover that is pivotally attached to an L-shaped wall mounting bracket. A main baffle is provided within the interior of the enclosure. The main baffle includes a step portion to ensure a smooth airflow, and in one aspect the main baffle is slanted upwardly toward a side wall of the enclosure. The main baffle separates the interior into first and second compartments. In addition, the main baffle isolates first and second airflows in each compartment from one another. Each airflow enters the respective compartment of the enclosure via air intake vents, removes heat from equipment that is contained in the compartment and exits the compartment via air output vents.

In one aspect of the invention, the second airflow may be generated by a plurality of fans drawing air through a plurality of air intake vents. The forced airflow removes heat from the equipment contained within the second compartment and is redirected by the main baffle to an air duct that provides an exit for the heated air from the second compartment of the enclosure via air output vents.

In another aspect of the invention, the convection of air heated by the equipment in the second compartment of the enclosure provides the driving force for air movement. In this aspect, air enters the second compartment of the enclosure via air intake vents and removes heat from the equipment in the second compartment. The airflow is redirected by the main baffle to an air duct which directs the trajectory of the heated air to an air output vent.

In another aspect of the invention, a secondary baffle is included in the first compartment to split the first airflow into third and fourth airflows. The secondary baffle includes a step portion to provide a smooth airflow across the secondary baffle.

In another aspect of the invention in which the first and second compartments are vertically oriented with respect to one another, the air duct is a chimney that includes a flue portion, a buffer portion, and an exit opening. The buffer portion provides an increased draft through the chimney.

Additional aspects, features and advantages of the present invention are also described in the following Detailed Description.

BRIEF DESCRIPTION OF THE SEVERAL VIEWS OF THE DRAWING

The invention will be more fully understood by reference to the following Detailed Description of the Invention in conjunction with the drawings of which.

DETAILED DESCRIPTION OF THE INVENTION

Figure 1:
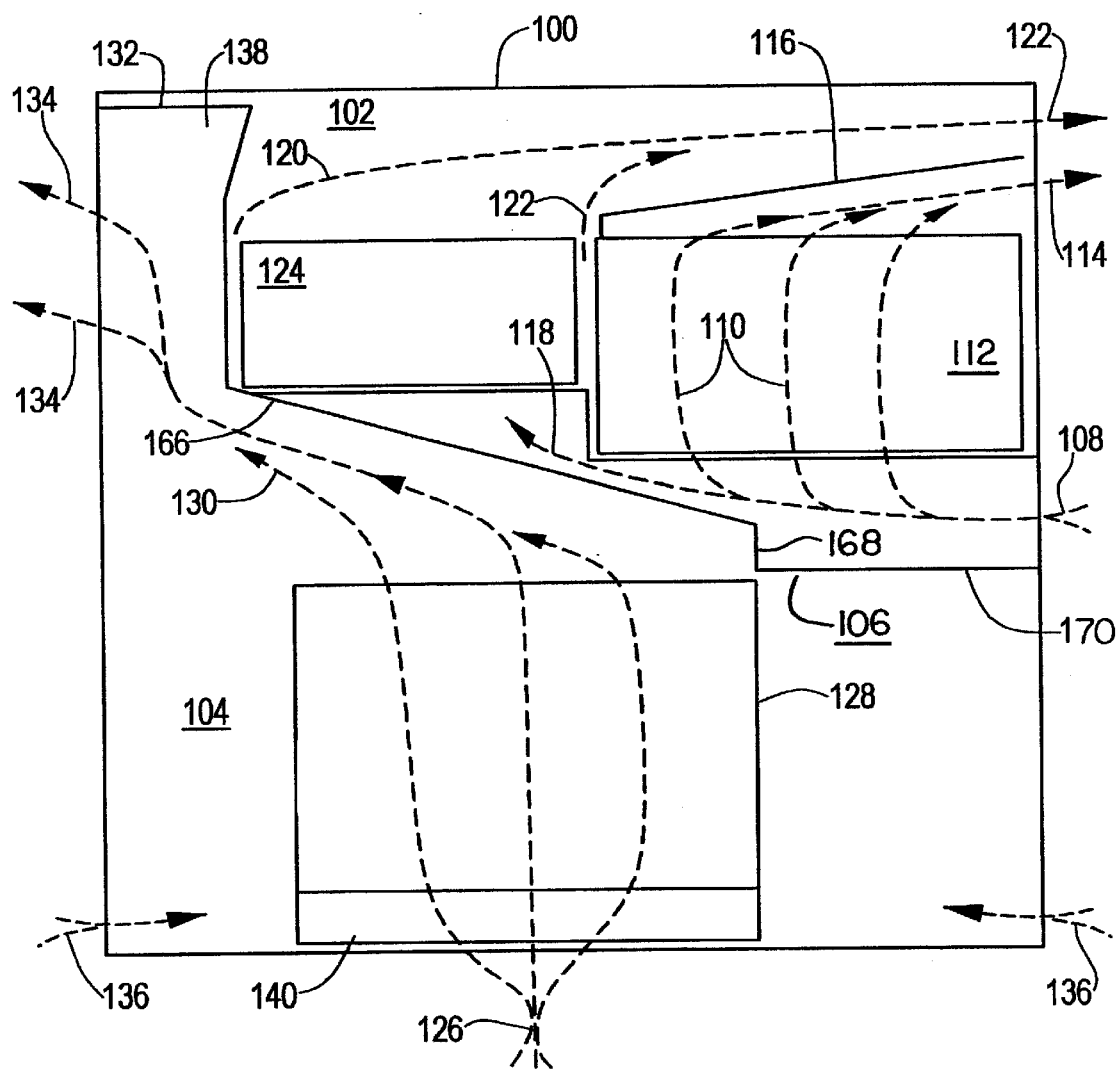
FIG. 1 is a front cross-sectional view of an enclosure consistent with the present invention.

FIG. 1 illustrates an enclosure 100 having compartments 102, 104 that contain heat-generating equipment and are physically separated by a main baffle 106. The main baffle 106 isolates a cooling airflow that is used to cool the heat generating equipment in each compartment from the other compartment. This use of separate airflows to cool the heat generating equipment within the enclosure allows for the more efficient use of space by the heat generating equipment contained within the enclosure while ensuring that sufficient heat transfer occurs from each piece of heat generating equipment.

Figure 4:
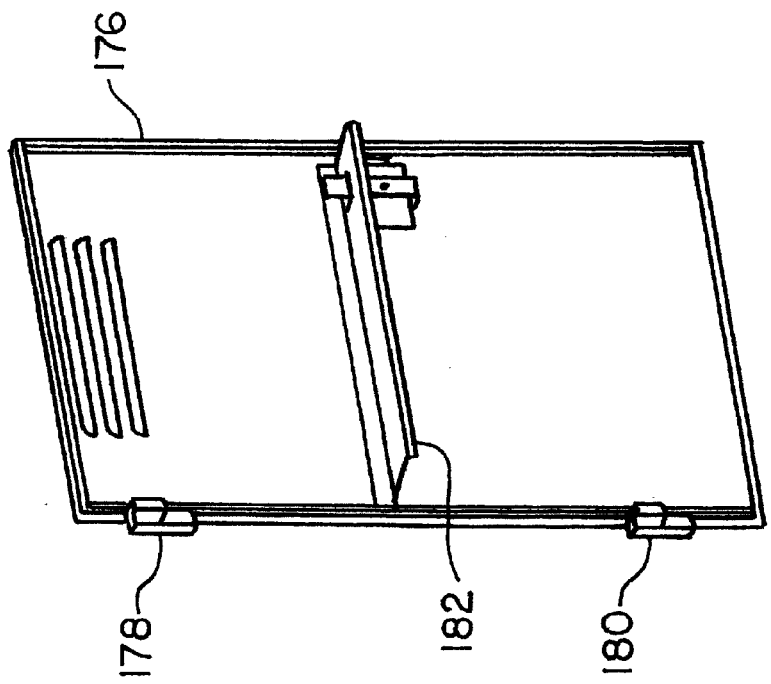
FIG. 4 is a perspective view of the interior side of an enclosure door for use with the enclosure illustrated in FIG. 1.

In particular, the upper compartment 102 includes an input airflow 108 that is directed by the main baffle 106 to form an airflow 110 that is heated by the heat generating equipment 112. The heated air from heat generating equipment 112 forms airflow 114, which is redirected by a secondary baffle 116 to a plurality of air output vents (not shown). Additionally, an airflow 118 is directed by the main baffle 106 to form air flows 120 and 122 that cool heat generating equipment 124. The heated air from heat-generating equipment 124 forms airflow 122, which is directed by the secondary baffle 116 away from the heat generating equipment 112 and exits via the air output vents (not shown). Airflow 122 may also exit the enclosure via louvered air output vents in a door as described below (FIG. 4). Alternatively, heat generating equipment 124 may include top and bottom vents similar to equipment 112, in which case an airflow analogous to airflow 110 flows through equipment 124.

In the illustrated embodiment, the airflows in the upper compartment 102 are convection airflows that occur due to the heating effect of the equipment 112 and 124. In alternative embodiments, a forced airflow may also be used in the first compartment 102 wherein fans (not shown) generate the forced airflow.

Lower compartment 104 includes an input airflow 126 that cools heat-generating equipment 128. The heated air leaving the heat generating equipment 128 is redirected by the underside of the main baffle 106 away from the upper compartment 102 and the heat generating equipment 112 and 124 contained therein. This heated air forms airflow 130 that is directed to an air duct 132 that is open on the side facing the side of the enclosure. Airflow 134 is formed and exits the enclosure through output air vents (not shown).

Additional cooling of the equipment 128 may be provided by airflows 136 entering the lower compartment 104 through lower air input vents (not shown).

The airflows 126 and 136 may be generated by convection or be forced airflows generated by one or more fans. When convection cooling is used, a buffer area 138 traps some heated air, which improves the draft within the air duct 132, increasing the efficiency of the airflow 134 through the air duct 132.

To provide a forced airflow in the lower compartment 104, a fan tray 140 containing a plurality of upward facing fans (not shown in FIG. 1) is disposed at the bottom of the equipment 128. Each fan is disposed substantially above a corresponding one of a plurality of air intake apertures (not shown) at the bottom of the enclosure. Even when the fans in the fan tray 140 are turned off, air flows via convection through these openings and assists in cooling the heat generating equipment 128.

In the illustrated embodiment in which the upper and lower compartments 102 and 104 are vertically oriented with respect to one another, air duct 132 acts as a chimney that includes the buffer area 138 and an open side facing the side of the enclosure. Airflow 130 enters the air duct 132 and exits the air duct 132 via the open side, which is coupled to air output vents. For improved convection airflow, the air duct 132 should be sufficiently long to establish the desired draft effect. In one preferred embodiment, where the enclosure 100 is to be cooled by convection airflow, the air duct 132 extends the height of the enclosure 100 to ensure that a sufficient draft is created and that airflow 134 is sustained.

Other orientations between the compartments 102 and 104 are anticipated. For example, in one embodiment, the compartments 102 and 104 may be horizontally oriented with respect to one another. In this orientation, forced air cooling could be used for either or both compartments, and air ducting may be used to provide an exit trajectory for the heated airflow. Alternatively, convection air currents may be used to cool the heat-generating equipment in each compartment, with a baffle used to isolate and redirect the cooling airflows in each compartment.

Figure 2:
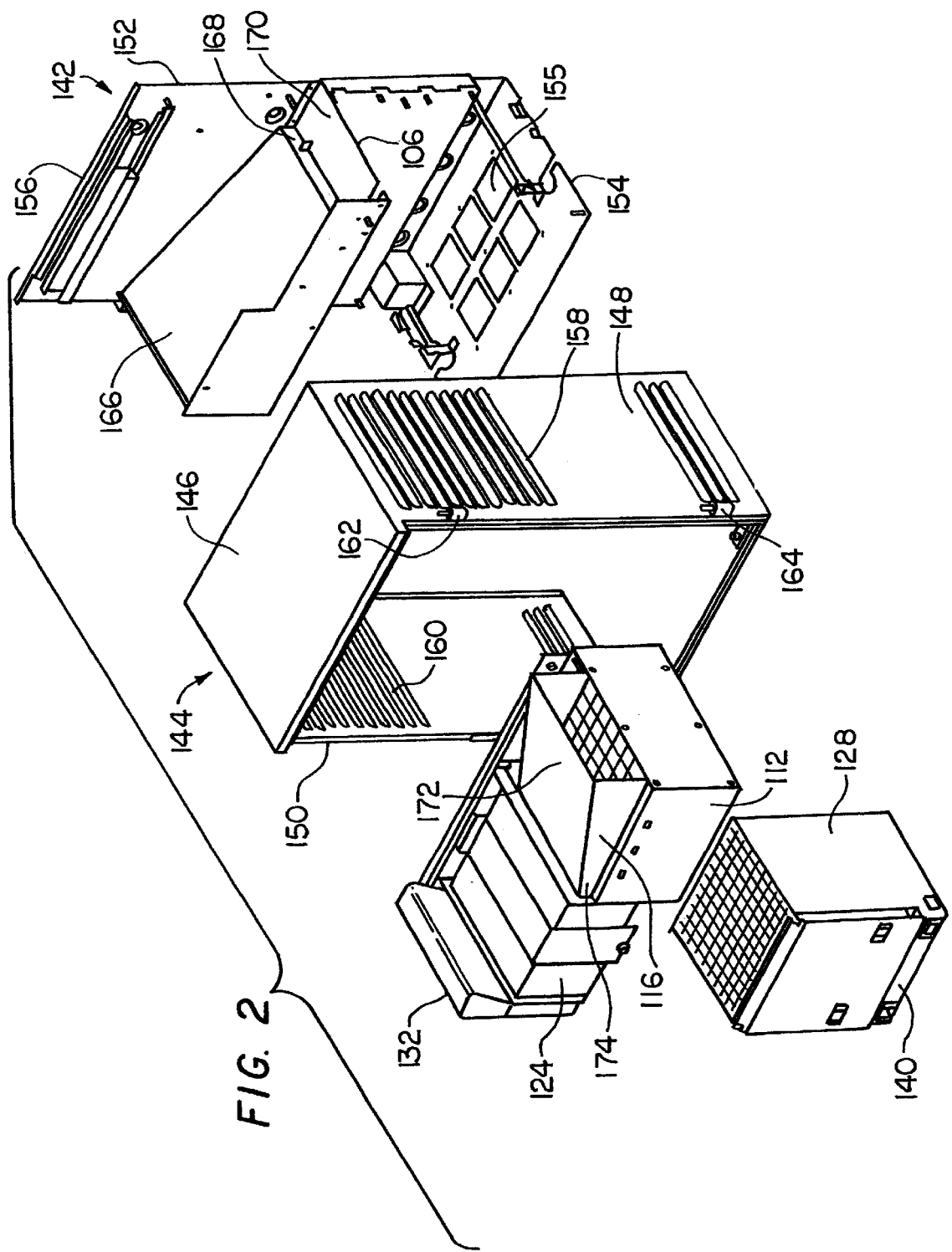
FIG. 2 is an exploded view of the enclosure of FIG. 1.
Figure 3:
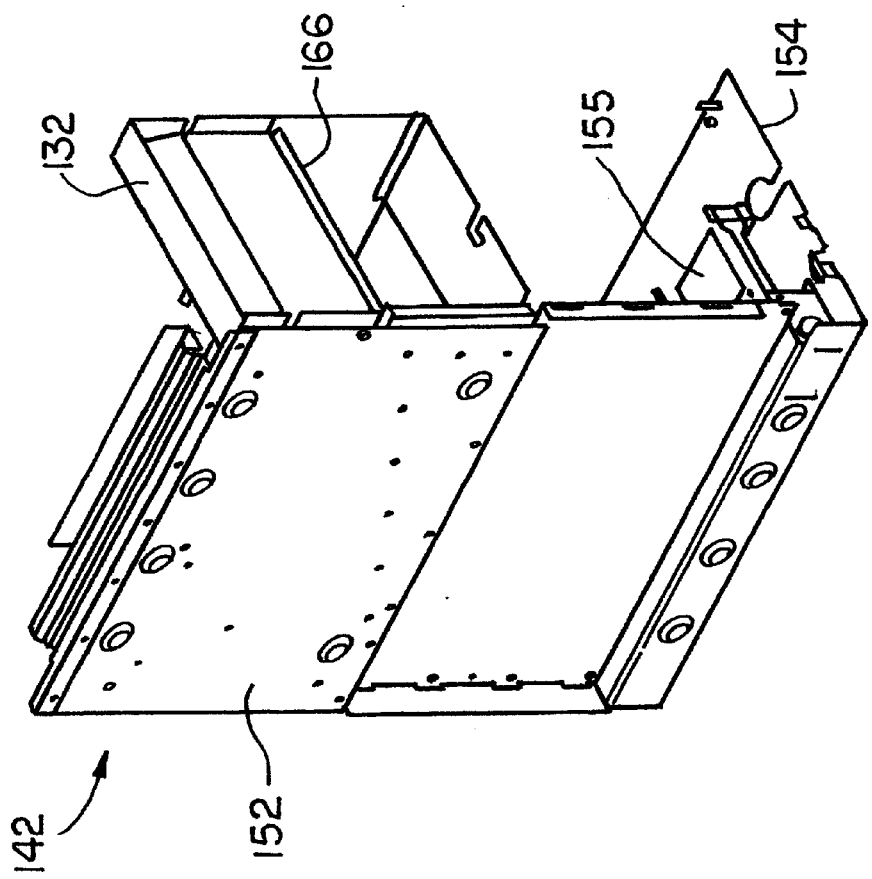
FIG. 3 is a perspective view of the rear of a back plate in the enclosure of FIG. 2.

As shown in FIGS. 2 and 3, the enclosure 100 includes a wall mounting bracket 142 and a three-sided removable cover 144. The three-sided removable cover 144 comprises a top side 146 that is rigidly attached to a first side wall 148 and a second side wall 150. The mounting bracket 142 includes a back panel 152 and a base plate 154 rigidly attached to the back panel 152. The wall mounting bracket 142 is rigidly attached to a wall by any suitable method that will provide the necessary physical stability and security. The base plate 154 includes a plurality of openings 155. As described above, the air flow 126 (FIG. 1) enters the lower compartment 104 through these openings 155.

The removable cover 144 is pivotally attached to the wall mounting bracket 142 via a pivot member (not shown) that is seated in a pivot member receiver 156 on the back panel 152. The enclosure further includes a plurality of louvers 158 and 160 on each of the first and second side walls 148 and 150 to provide air intake vents and air output vents for cooling the equipment contained within the enclosure 144. A door (not shown in FIGS. 2 and 3) is pivotally attached via hinge portions 162 and 164. As explained in more detail below, the door is an integral component for separating the airflow between the upper and lower compartments 102 and 104.

In the illustrated embodiment, primary baffle 106 includes a slanted portion 166 that slants downward from the second side wall 150 of the enclosure 144 to a step portion 168 that is offset from the first side wall 148 of the enclosure 144 by a spacing member 170. Step portion 168 and spacing member 170 help to ensure that the heated air flows smoothly along the underside of the baffle 106. This prevents the formation of hot spots. If hot spots were to occur, the baffle 106 could heat up and prematurely heat the cooling airflows 118 and 108 (FIG. 1) along the top surface of baffle 106 in the upper compartment 102. This premature heating could result in less efficient thermal transfer from the heat generating equipment 112 and 124 contained within the upper compartment 102.

Similarly, the secondary baffle 116 includes a slanted portion 172 that slants upward as it approaches the first side wall 148. The slanted portion 172 of the secondary baffle 116 begins at a step portion 174. Step portion 174 ensures that the heated air from the heat generating equipment 112 flows smoothly along the underside of the secondary baffle 116. If the air flow were not smooth, heat could be trapped within the secondary baffle 116 reducing the heat transfer from the heat generating equipment 112. This reduced heat transfer could cause thermal damage to the equipment 112.

Figure 5:
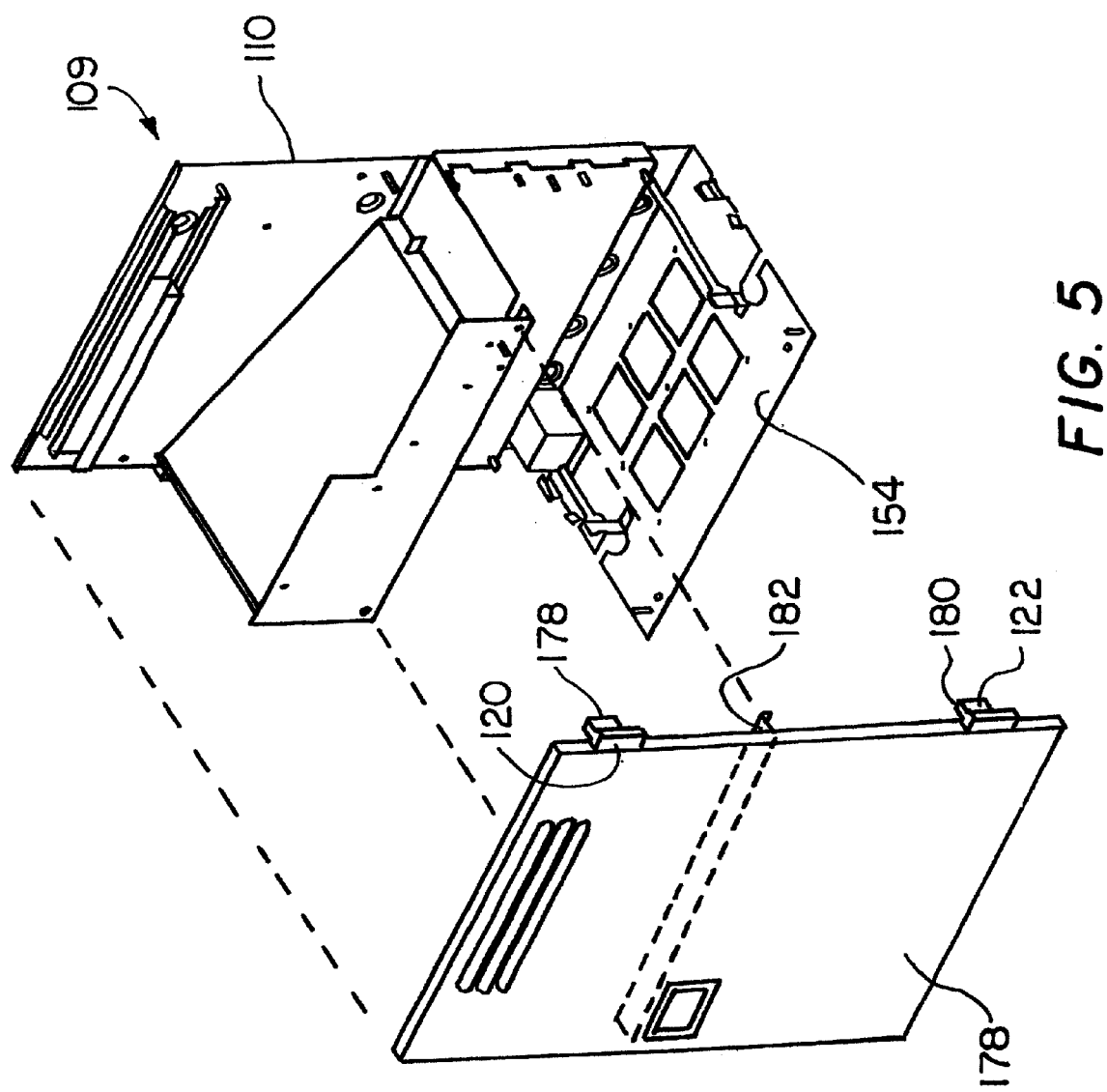
FIG. 5 is a perspective view of the door, door baffle and main baffle for use with the enclosure illustrated in FIG. 1.

FIGS. 4 and 5 illustrate a door 176 that assists in separating the airflows in the upper and lower compartments 102 and 104. The door 176 is pivotally attached to the cover 144 (FIG. 2) by a pair of hinge portions 178 and 180 which mate with the hinge portions 162 and 164 of the cover 144 respectively. A flow separator 182 is attached horizontally to the interior side of the door 176. The flow separator 182 and the main baffle 106 are configured and arranged to securely fit against one another to prevent the airflow 130 (FIG. 1) from entering the upper compartment 102. Alternatively, the inside surface of the door 176 can be configured and arranged to directly abut the front of the main baffle 106 to prevent the airflow 130 in the lower compartment 104 from entering the upper compartment 102.

Those skilled in the art should further appreciate that variations to and modification of the above-described enclosure having separate cooling airflows may be made without departing from the inventive concepts disclosed herein. Accordingly, the invention should be viewed as limited solely by the scope spirit of the appended claims.

What is claimed is:

1. An enclosure containing first and second pieces of heat generating electronic equipment each having an end and a pair of side walls, the enclosure comprising;
    a first and second plurality of air intake vents and a first and second plurality of air output vents;
    a main baffle disposed within said enclosure between said first and second pieces of equipment to direct first and second cooling airflows to said first and second pieces of equipment respectively, said main baffle having a step portion generally aligned with one of said side walls of said second piece of equipment and providing a spaced apart relationship between said end of said second piece of equipment and said main baffle to provide for a smooth airflow and to prevent hot spots from being formed on the main baffle;
    an air duct having an air input coupled to said second airflow and an air duct output vent spaced apart from said air input, the air duct output vent coupled to said second plurality of air output vents, wherein said air duct conveys said second airflow from said second piece of equipment to said second plurality of air output vents;
    said first cooling airflow entering said enclosure via said first air intake vents, being directed by said main baffle to said first piece of equipment, cooling said first piece of equipment, and exiting said enclosure via said first plurality of output vents;
    said second cooling airflow entering said enclosure via said second air intake vents, cooling said second piece of equipment, and being directed by said main baffle to said air duct and coupled to said second plurality of air output vents by said air duct, and exiting said enclosure via said second plurality of air output vents.

2. The enclosure of claim 1 wherein said first and second pieces of equipment are vertically oriented with respect to one another, and wherein said air duct acts as a chimney including a flue, a buffer portion to enhance said convection draft in said chimney, and an output opening.

3. The enclosure of claim 1 further comprising a secondary baffle said secondary baffle disposed within the enclosure to redirect said first cooling airflow from said first piece of equipment to said first plurality of air output vents, said secondary baffle having a step portion generally aligned with one of said side walls of said first piece of equipment and providing a spaced apart relationship between said end of said first piece of equipment and said secondary baffle to provide for a smooth airflow and to prevent hot air from being trapped within the secondary baffle.

4. The enclosure of claim 1 further comprising an enclosure door attached to said enclosure, said enclosure door having disposed thereon a flow separator configured and arranged to abut said main baffle to reduce mixing of said first and second airflows with one another.

5. The enclosure of claim 1 further comprising an enclosure door attached to said enclosure, said enclosure door having an interior side, a flow separator attached to said interior side of said enclosure door, the flow separator configured and arranged to abut said main baffle to reduce mixing of said second and first airflows with one another.

6. The enclosure of claim 1 wherein said end of said first piece of equipment includes an opening.

7. The enclosure of claim 1 wherein said end of said second piece of equipment includes an opening.

8. An enclosure containing first and second pieces of heat generating equipment each having an end and a pair of side walls, the enclosure comprising:
    a first and second plurality of air intake vents and a first and second plurality of air output vents;
    a main baffle disposed within said enclosure between said first and second pieces of equipment to direct first and second cooling airflows to said first and second pieces of equipment respectively, said main baffle having a step portion aligned with one of said side walls of said second piece of equipment and providing a spaced apart relationship between said end of said second piece of equipment and said main baffle to provide for a smooth airflow and to prevent hot spots from being formed on the main baffle;
    an air duct having an air input coupled to said second airflow and an air output vent spaced apart from the air input, the air duct output vent coupled to said second plurality of air output vents, wherein said air duct conveys said second airflow from said second piece of equipment to said second plurality of air output vents;
    said first cooling airflow entering said enclosure via said first air intake vents, being directed by said main baffle to said first piece of equipment, cooling said first piece of equipment, and exiting said enclosure via said first plurality of output vents;
    at least one fan to provide said second cooling airflow, said second airflow entering said enclosure via said second air intake vents, cooling said second piece of equipment, being directed by said main baffle to said second plurality of air output vents, and exiting said enclosure via said second plurality of output vents.

9. The enclosure of claim 8 further comprising a secondary baffle disposed within said enclosure to redirect said first cooling airflow from said first piece of equipment to said second plurality of air output vents, said secondary baffle having a step portion generally aligned with one of said side walls of said first piece of equipment and providing a spaced apart relationship between said end of said first piece of equipment and said secondary baffle to provide for a smooth airflow and to prevent hot air from being trapped within the secondary baffle.

10. The enclosure of claim 8, further comprising an enclosure door attached to said enclosure, said enclosure door having disposed thereon an airflow separator configured and arranged to interact with said main baffle to reduce mixing of said second and first airflows with one another.

11. A wall mount enclosure containing first and second pieces of heat generating equipment each having an end and a pair of side walls, the enclosure comprising:
    a wall mount bracket having a back plane and a base plate;

a three sided cover including a top side and first and second side walls, said three sided cover being attached to said wall mount bracket forming an enclosure, said three sided cover having an interior, an exterior, a front and a back;

a main baffle mounted on said interior side of said back plane, said main baffle slanting upward from said first side to said second side of said cover, wherein said main baffle divides said interior of said enclosure into first and second thermal chambers, said first and second thermal chambers containing said first and second pieces of equipment respectively, said main baffle having a step portion being generally aligned with one of said side walls of said second piece of equipment and providing a spaced apart relationship between said end of said second piece of equipment and said main baffle;

an air duct coupled to said second thermal chamber, said air duct having an input end coupled to said second thermal chamber and an output vent spaced apart from said air duct input end;

said three sided cover including a first set of air intake vents coupled to said first thermal chamber, a second set of air intake vents coupled to said second thermal chamber, a first set of air output vents coupled to said first thermal chamber, and a second set of air output vents coupled to said air duct output vent;

a first cooling airflow entering said first thermal chamber via said first set of air intake vents and cooling said first piece of heat generating equipment, said first cooling airflow being redirected to exit said first thermal chamber via said first air output vent by a secondary baffle having a step portion, said step portion being generally aligned with one of said side walls of said first piece of equipment and providing a spaced apart relationship between said end of said first piece of equipment and said secondary baffle;

a second cooling airflow entering said second thermal chamber via said second air intake vents and cooling said second piece of heat generating equipment said second cooling airflow being redirected by said main baffle to exit said second thermal chamber via said air duct and exiting said enclosure via output vent and said second set of air output vents;

an enclosure door attached to said cover, said door including an airflow separator configured and arranged to abut said main baffle to reduce airflow between said second and first thermal chambers.

12. The enclosure of claim 11 wherein said first and second thermal chambers are vertically oriented relative to one another, said air duct acting as a chimney.

* * * * *

UNITED STATES PATENT AND TRADEMARK OFFICE
CERTIFICATE OF CORRECTION

PATENT NO.     : 6,400,567 B1
DATED          : June 4, 2002
INVENTOR(S)    : John McKeen et al.

It is certified that error appears in the above-identified patent and that said Letters Patent is hereby corrected as shown below:

<u>Title page,</u>
Item [75], Inventors, "Franklin Lakes, NY" should read -- Franklin Lakes, NJ --.

Signed and Sealed this

Fifteenth Day of June, 2004

JON W. DUDAS
*Acting Director of the United States Patent and Trademark Office*